(12) United States Patent
Tramet et al.

(10) Patent No.: US 9,705,214 B2
(45) Date of Patent: Jul. 11, 2017

(54) ELECTRICAL CONTACT AND ELECTRONIC CIRCUIT

(71) Applicant: Valeo Systemes de Controle Moteur, Cergy Saint Christophe (FR)

(72) Inventors: Guillaume Tramet, Montesson (FR); Jean-Yves Moreno, La Possoniere (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 0 days.

(21) Appl. No.: 14/438,030

(22) PCT Filed: Oct. 1, 2013

(86) PCT No.: PCT/FR2013/052335
§ 371 (c)(1),
(2) Date: Apr. 23, 2015

(87) PCT Pub. No.: WO2014/064356
PCT Pub. Date: May 1, 2014

(65) Prior Publication Data
US 2015/0288086 A1  Oct. 8, 2015

(30) Foreign Application Priority Data
Oct. 25, 2012 (FR) ..................... 12 60163

(51) Int. Cl.
*H01R 12/58* (2011.01)
*H01R 13/11* (2006.01)
(Continued)

(52) U.S. Cl.
CPC ......... *H01R 12/585* (2013.01); *H01R 12/718* (2013.01); *H01R 13/11* (2013.01); *H05K 3/32* (2013.01); *H01R 12/58* (2013.01); *H05K 3/306* (2013.01); *H05K 2201/1059* (2013.01); *H05K 2201/10295* (2013.01); *H05K 2201/10962* (2013.01)

(58) Field of Classification Search
CPC .. H01R 13/665; H01R 12/57; H01R 12/7076; H01R 12/721; H01R 13/5808; H01R 13/6469; H01R 13/6658
See application file for complete search history.

(56) References Cited

U.S. PATENT DOCUMENTS 5,131,853 A  7/1992  Meyer
5,169,322 A  12/1992  Frantz et al.
(Continued)

OTHER PUBLICATIONS

International Search Report issued in PCT/FR2013/052335 mailed on Jan. 16, 2014 (4 pages).

*Primary Examiner* — Truc Nguyen
(74) *Attorney, Agent, or Firm* — Osha Liang LLP

(57) ABSTRACT

The electrical contact (200) comprises a contact part (212) exhibiting a surface (228, 230) intended to be in contact with the surface of a support, and a clip (202) intended to receive a pin of an electrical component, so that the pin received lies along a main axis parallel to an up/down direction. The clip (202) comprises at least two jaws (204, 206, 208, 210) around the axis A, which are intended to grip the pin laterally, each jaw (204, 206, 208, 210) exhibiting a fixed end and a free end, and the contact surface is formed by at least one flange (228, 230) intended to come to bear on said surface of the support.

15 Claims, 3 Drawing Sheets

Figure 1:
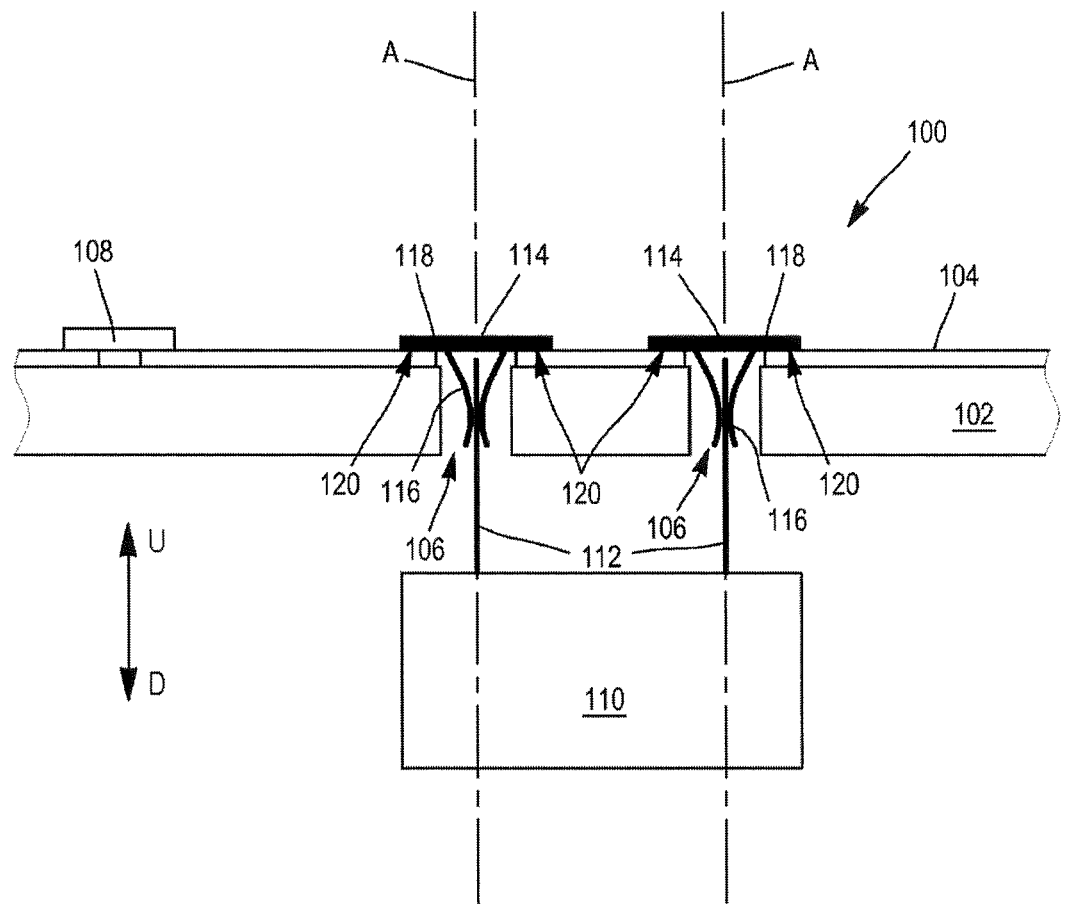

(51) Int. Cl.
 *H05K 3/32* (2006.01)
 *H01R 12/71* (2011.01)
 *H05K 3/30* (2006.01)

(56) References Cited

U.S. PATENT DOCUMENTS

| | | | |
|---|---|---|---|
| 5,733,133 A | 3/1998 | Matsumura | |
| 5,919,051 A * | 7/1999 | Mitra | H01R 12/716 439/74 |
| 6,099,347 A * | 8/2000 | Hoyt | H01R 43/26 439/483 |
| 6,428,350 B1 * | 8/2002 | Robinson | G01R 11/04 361/662 |
| 6,554,633 B1 * | 4/2003 | Nobuyuki | H01R 13/193 439/259 |
| 7,581,965 B1 * | 9/2009 | Upasani | H05K 3/32 439/82 |
| 7,867,007 B2 * | 1/2011 | Szu | H01R 13/193 439/342 |
| 8,435,052 B2 * | 5/2013 | Potters | H01R 12/57 439/80 |
| 2002/0037664 A1 * | 3/2002 | Robinson | G01R 11/04 439/517 |
| 2015/0180146 A1 * | 6/2015 | Filman | H01R 12/7076 439/78 |

\* cited by examiner

ELECTRICAL CONTACT AND ELECTRONIC CIRCUIT

The present invention relates to an electrical contact and to an electronic circuit.

An electronic circuit generally comprises an insulating support and conductive tracks extending over the insulating support.

In order to connect a connection pin of an electronic component to one of the tracks, it is known to pierce the electronic circuit with a perforation opening onto this track, and to use an electrical contact comprising a contact part having a surface connected by material fusion against the track and a clip which extends through the perforation and is intended to receive the pin.

In a first known example, the clip is formed by a cylinder containing a very large number of rods extending longitudinally beside one another against the internal wall of the cylinder. The rods are bulged toward the center of the cylinder and are fixed to the cylinder at their two ends. In this way, the rods define a constriction into which the pin is intended to be inserted so as to move apart the rods which, in response, will grip the pin and thus hold it in the contact.

Such a contact is complicated to manufacture because of the numerous rods which need to be assembled, and which in particular need to be fixed at their two ends.

In another known example of an electrical contact, the clip is formed by two jaws in the form of a tongue, facing one another. Each tongue has a fixed end and a free end, the free ends being intended to grip the pin. Such a contact is easier to manufacture and may, in particular, be formed by a single cut and folded metal sheet.

However, such a contact does not offer very good holding of the pin.

The need for a new type of electrical contact, making it possible to solve the problems indicated above at least in part, has therefore arisen.

In order to achieve this object, the invention relates to an electrical contact comprising: a contact part having a surface intended to be connected by material fusion to an electrical track extending over an insulating support; and a clip intended to receive a pin of an electrical component so that the received pin extends along a principal axis parallel to an up/down direction; characterized in that the clip comprises at least three jaws around the axis, which are intended to laterally grip the pin, each jaw having a fixed end and a free end.

For example, the up/down direction corresponds to a longitudinal direction of the electrical contact.

According to one characteristic of the invention, the clip comprises two pairs of jaws, the jaws of each pair being arranged facing one another in an engagement direction transverse to the up/down direction, so as to grip the pin along said engagement direction, the two engagement directions being different to one another.

According to another characteristic of the invention, the two engagement directions are perpendicular.

According to one characteristic of the invention, each jaw has the shape of a tongue having a large side facing toward the axis and is flexible so as to be elastically deformed by the pin in order to move away from the axis when the pin is inserted. For example, when it is inserted the pin comes in contact with the large side facing toward the principal axis.

According to another characteristic of the invention, the jaws are of constant width.

According to another characteristic of the invention, the jaws have a width decreasing from the fixed end to the free end.

According to another characteristic of the invention, the electrical contact furthermore comprises a ring centered on the principal axis, and the jaws extend downward below the ring.

According to another characteristic of the invention, the fixed ends of the jaws are attached to a lower side of the ring.

According to another characteristic of the invention, the fixed ends of the jaws are attached to an upper side of the ring, and the jaws are curved in order to pass through the ring.

According to another characteristic of the invention, the contact part comprises the lower side of the ring.

According to another characteristic of the invention, the contact surface extends between the fixed ends of the jaws.

According to another characteristic of the invention, the contact surface extends all around the ring.

According to another characteristic of the invention, the contact part comprises at least one contact tongue comprising a fixed end and a free end, the fixed end being attached to the upper side of the ring, the contact tongue being curved so that the free end has an edge directed downward, and the contact surface comprising the edge of the free end of the contact tongue.

According to another characteristic of the invention, the clip and the contact part are formed from a single cut and folded metal sheet.

The invention furthermore relates to an electronic circuit comprising: a contact according to the invention; an insulating support; and an electrical track extending over the insulating support; the insulating support and the electrical track being pierced by a perforation, the contact surface being connected by material fusion to the electrical track, and the clip extending through the perforation.

The invention also relates to an electrical contact comprising:
  a contact part having a surface intended to be in contact with the surface of a support, and
  a clip intended to receive a pin of an electrical component so that the received pin extends along a principal axis parallel to an up/down direction, characterized in that:
  the clip comprises at least two jaws around the axis, which are intended to laterally grip the pin, each jaw having a fixed end and a free end, and in that
  the contact surface is formed by at least one edge intended to bear on said support surface, in particular during assembly of the electrical contact with the support, more particularly during positioning of the electrical contact in a perforation of said support.

The contact surface of the electrical contact is, for example, intended to be connected by material fusion to an electrical track extending over an insulating support. The contact surface of the electrical contact is, in particular, intended to come in contact with an external surface of the support, which constitutes for example a face of the support.

According to one variant, the clip of the electrical contact comprises three jaws.

According to one variant, the contact part comprises at least one tongue, of which at least a part of an edge forms said contact surface and is intended to bear on said surface of the support, in particular during assembly of the electrical contact with the support, more particularly during positioning of the electrical contact in a perforation of said support.

More particularly, the tongue comprises a part extending along a principal axis parallel to the up/down direction, which corresponds in particular to a longitudinal direction of the electrical contact, so that an edge of said part of the tongue is intended to bear on said surface of the support, in particular during assembly of the electrical contact with the support, more particularly during positioning of the electrical contact in a perforation of said support.

According to one variant, the electrical contact comprises a ring centered on the principal axis and the jaws extend downward below the ring.

In one particular example, said ring corresponds to said tongue of the contact part, which has a curved shape so as to be shaped as a ring.

In one particular example, said tongue of the contact part has a fixed end and a free end, the fixed end being attached to the upper side of the ring, the contact tongue being curved so that the free end has an edge directed downward, and the contact surface comprising the edge of the free end of the contact tongue.

Of course, the different variants and embodiments of the invention may be combined with one another in a variety of combinations, so long as they are not mutually incompatible or exclusive. In particular, the electrical contact described last may have any one of the characteristics described previously.

Furthermore, various other characteristics of the invention will become apparent from the following description, given with reference to the drawings which illustrate nonlimiting embodiments of the invention.

Figure 2:
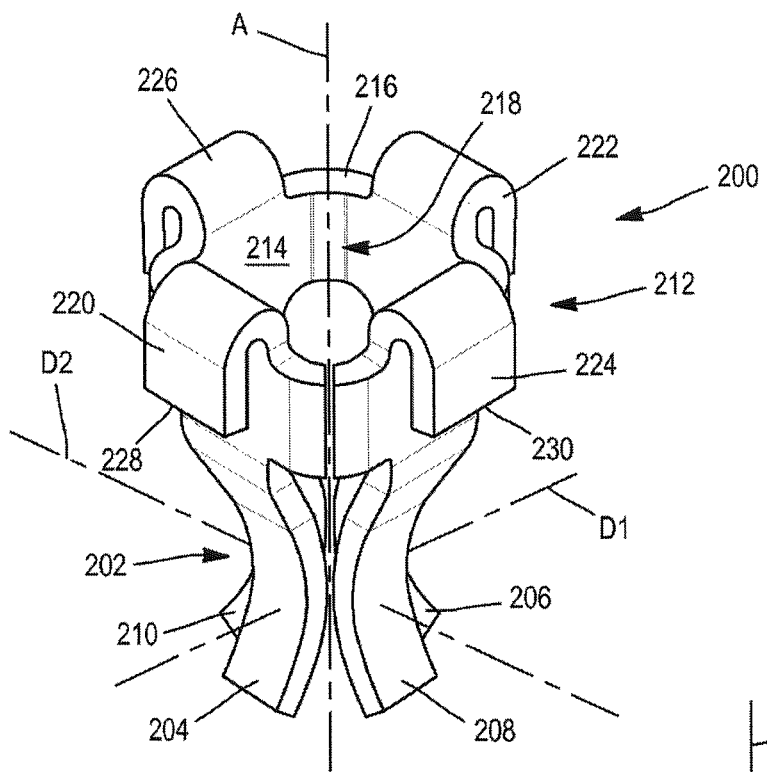
Figure 3:
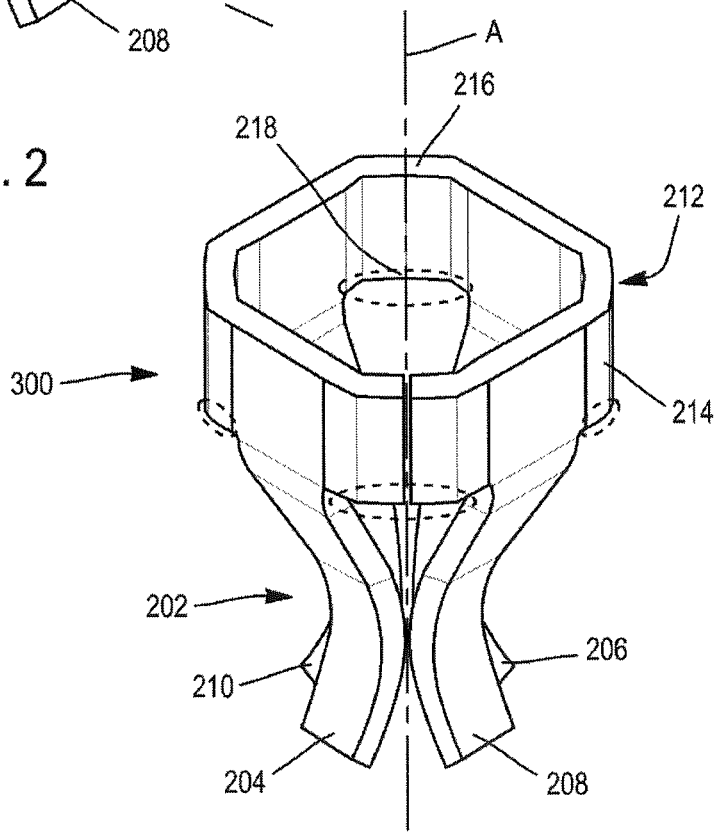
Figure 4:
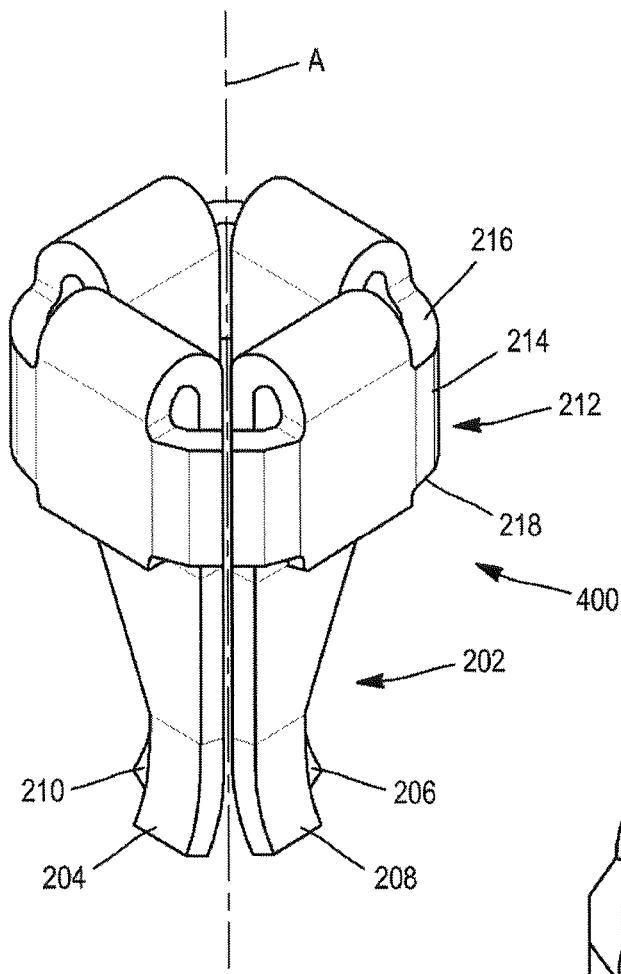
Figure 5:
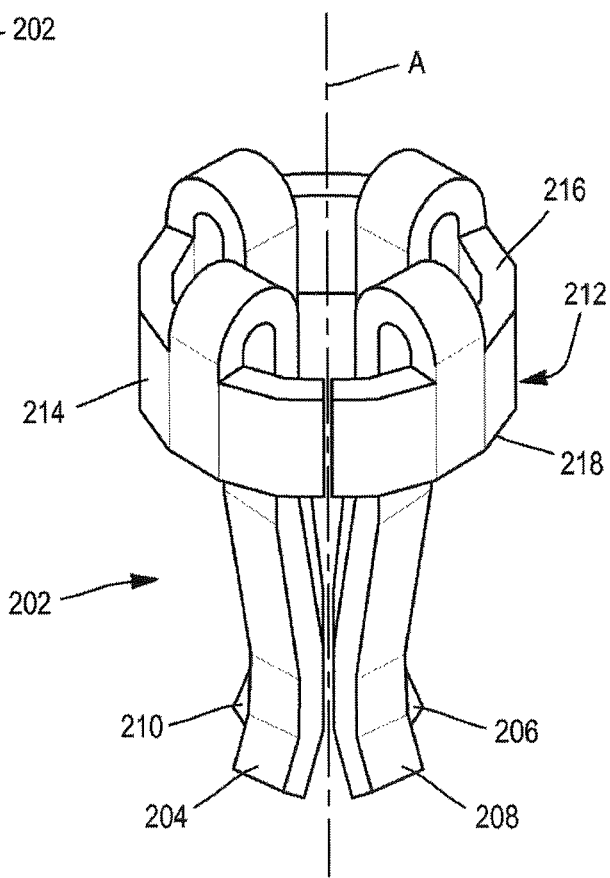

FIG. 1 is a view in section of an electronic circuit using the invention,

FIG. 2 is a three-dimensional view of a first example of an electrical contact using the invention and intended to be integrated into the electronic circuit of FIG. 1, FIG. 3 is a three-dimensional view of a second example of an electrical contact using the invention and intended to be integrated into the electronic circuit of FIG. 1, FIG. 4 is a three-dimensional view of a third example of an electrical contact using the invention and intended to be integrated into the electronic circuit of FIG. 1, FIG. 5 is a three-dimensional view of a fourth example of an electrical contact using the invention and intended to be integrated into the electronic circuit of FIG. 1.

Referring to FIG. 1, an electronic circuit using the invention, having the overall reference 100, will be described.

The electronic circuit 100 comprises an insulating support 102 and conductive tracks extending over the insulating support 102, including the track 104 represented in FIG. 1. The insulating support 102 has the shape of a board perpendicular to an up/down direction (U and D in the figure). This up/down direction will be used below to define the relative positions of the various elements described. It is, however, clear that this direction may be different to the vertical direction, depending on the actual inclination of the electronic circuit 100. The electronic circuit 100 is generally referred to by the acronym PCB (printed circuit board). The insulating support 102 is, for example, made of epoxy resin or glass fiber, or a combination of the two such as the material known by the designation FR4 or FR-4.

The insulating support 102 and the track 104 are pierced by perforations 106 in the up/down direction, which open onto the track 104.

The electronic circuit 100 may furthermore comprise at least one surface-mount electronic component, such as the component 108 represented in FIG. 1. Each surface-mount component is, for example, reflow-soldered onto one of the conductive tracks.

The electronic circuit 100 may furthermore comprise at least one attached electronic component, such as the component 110 represented in FIG. 1. The component 110 is, for example, an insulated-gate bipolar transistor, generally referred to by the acronym IGBT, or an electrical connector, or an electrical bus (busbar). The attached component 110 comprises, in particular, connection pins 112 in the shape of rods. The pins 112 are respectively inserted into the perforations 106. In the example described, the component 110 is located on the opposite side of the support 102 from the conductive tracks, so that the connection pads 112 have free ends on the side of the conductive tracks.

The electronic circuit furthermore comprises electrical contacts 114 for connecting the connection pads 112 to the track 104. Each contact 114 firstly comprises a clip 116 intended to removably receive a respective pin 112 along an axis A parallel to the up/down direction, so that the received pin 112 extends along the axis A. In other words, the clip 116 extends along the axis A along which the pin 112 is introduced into the contact 120. Each clip 116 extends through a respective perforation 106. Each contact 114 furthermore comprises a contact part 118 having a contact surface 120 directed downward and intend to be connected by material fusion to the track 104.

Referring to FIGS. 2 to 5, four examples of an electrical contact using the invention and intended to be employed as an electrical contact 114 will be described. Each of these contacts is formed by a single metal sheet cut and folded in order to obtain the desired shape.

Referring to FIG. 2, a first example of an electrical contact, denoted by the overall reference 200, will now be described.

The contact 200 comprises a clip 202 intended to receive a connection pin of an electrical component, such as one of the pins 112 of FIG. 1, so that the received pin extends along the axis A. The clip 202 comprises at least three jaws around the axis A, between which the pin is intended to be gripped laterally. In the example described, the clip 202 comprises two pairs of jaws 204 and 206, and 208 and 210. The jaws 204, 206 and 208, 210 of each pair are arranged facing one another along a transverse holding axis D1, D2, respectively, perpendicular to the axis A, so as to grip the pin along thi axis D1, D2, respectively. More precisely, each jaw 204, 206, 208, 210 has a fixed end and a free end, the latter being intended to come in contact with the pin in order to grip it. The two holding axes D1, D2 are different to one another. In the example described, the two holding axes D1, D2 are perpendicular to one another. Furthermore each jaw 204, 206, 208, 210 has the shape of a tongue having a large side facing toward the axis A and is flexible so as to be elastically deformed by the pin in order to move away from the axis A when the pin is inserted. In the example described, the jaws 204, 206, 208, 210 are of constant width.

The contact 200 furthermore comprises a contact part 212 intended to be connected to a track, such as the track 104 of FIG. 1. In the example described, the contact part 212 comprises a ring 214 centered on the axis A and having an upper side 216 and a lower side 218. In the example described, the ring 214 is of cylindrical shape and the upper side is formed by the upper edge of the ring 214, while the lower side is formed by the lower edge of the ring 214. The fixed ends of the jaws 204, 206, 208, 210 are attached to the lower side 218 of the ring 214 and extend downward below the ring 214. Furthermore, the free ends of the jaws 204, 206, 208, 210 are curved oppositely to the axis A, that is to say so as to move away from the axis A, in order to facilitate insertion of the pin from below.

The contact part 212 comprises four contact tongues 220, 222, 224, 226, each comprising a fixed end and a free end. The fixed end is attached to the upper side 216 of the ring 214. Each contact tongue 220, 222, 224, 226 is curved so that its free end has an edge 228, 230 directed downward (only the edges 228, 230 of the two contact tongues 220, 224 can be seen in FIG. 2). The four edges 228, 230 form a contact surface intended to be connected by material fusion to a track, such as the track 104 in FIG. 1.

Referring to FIG. 3, a second example of an electrical contact, denoted by the overall reference 300, will now be described. The elements which are the same as those of the contact 200 of FIG. 2 will not be described again and have the same references.

The contact 300 is identical to the contact 200, except for the fact that it does not have the contact tongues 220, 224, 226, 228.

Thus, the contact surface is in this case formed by the four parts of the lower side 218 of the ring 214 which extend between the jaws 204, 206, 208, 210. The contact surface is indicated by dashes in FIG. 3.

The clip 202 of the contact 300 is intended to be inserted into a square perforation, so that the four parts of the lower side 218 of the ring 214 respectively lie on the four sides of the square.

Referring to FIG. 4, a third example of an electrical contact, denoted by the overall reference 400, will now be described. The elements which are the same as those of the contact 300 of FIG. 3 will not be described again and have the same references.

The contact 400 is identical to the contact 300, except for the fact that the fixed ends of the jaws 204, 206, 208, 210 are attached to the upper side 216 of the ring 214, and that the jaws 204, 206, 208, 210 are curved in order to pass through the ring 214 and extend downward below the ring 214. Furthermore, the jaws 204, 206, 208, 210 have a width decreasing from the fixed end to the free end. Thus the jaws 204, 206, 208, 210 have a large width at their fixed end, which improves their solidity. In this case, the ring 214 has an overall shape resembling that of a square.

In the contact 400, since the jaws 204, 206, 208, 210 extend from the upper side 216 of the ring, this allows the contact surface, formed by the lower side 218 of the ring 214, to extend all around the ring 214.

Referring to FIG. 5, a fourth example of an electrical contact, denoted by the overall reference 500, will now be described. The elements which are the same as those of the contact 400 of FIG. 4 will not be described again and have the same references.

The contact 500 is identical to the contact 400, except for the fact that the jaws 204, 206, 208, 210 in the shape of a tongue have a constant width. This makes it possible to impart a circular shape to the ring 214.

The invention is, of course, not limited to the examples described. For example, in FIG. 1 the component 110 could be located, in relation to the support 102, on the side comprising the conductive tracks, so that the connection pads 112 have free ends on the opposite side from the conductive tracks.

The invention claimed is:

1. An electrical contact, comprising:
   a contact part having a contact surface intended to be in contact with the surface of a support; and
   a clip for receiving a pin of an electrical component so that the received pin extends along a principal axis parallel to an up/down direction,
   wherein the clip comprises at least two jaws around the principal axis, the at least two jaws being configured to laterally grip the pin, each jaw having a fixed end and a free end, and
   wherein the contact surface is formed by at least one edge intended to bear on said support surface,
   wherein the electrical contact further comprises a ring centered on the principal axis, and
   wherein the at least two jaws extend downward below the ring.

2. The electrical contact as claimed in claim 1, wherein the clip comprises two pairs of jaws, the jaws of each pair being arranged facing one another in an engagement direction transverse to the up/down direction, so as to grip the pin along said engagement direction, the two engagement directions being different from one another.

3. The electrical contact as claimed in claim 2, wherein the two engagement directions are perpendicular.

4. The electrical contact as claimed in claim 1, wherein each jaw has the shape of a tongue having a large side facing toward the principal axis and is flexible so as to be elastically deformed by the pin in order to move away from the principal axis when the pin is inserted.

5. The electrical contact as claimed in claim 1, wherein the at least two jaws are of constant width.

6. The electrical contact as claimed in claim 1, wherein the at least two jaws have a width decreasing from the fixed end to the free end.

7. The electrical contact as claimed in claim 1, wherein the fixed ends of the at least two jaws are attached to a lower side of the ring.

8. The electrical contact as claimed in claim 1, wherein the fixed ends of the at least two jaws are attached to an upper side of the ring, and the at least two jaws are curved in order to pass through the ring.

9. The electrical contact as claimed in claim 7, wherein the contact part comprises the lower side of the ring.

10. The electrical contact as claimed in claim 9, wherein the contact surface extends between the fixed ends of the at least two jaws.

11. The electrical contact as claimed in claim 9, wherein the contact surface extends all around the ring.

12. The electrical contact as claimed in claim 1, wherein the contact part comprises at least one contact tongue comprising a fixed end and a free end, the fixed end being attached to the upper side of the ring, the contact tongue being curved so that the free end has an edge directed downward, and the contact surface comprising the edge of the free end of the contact tongue.

13. The electrical contact as claimed in claim 1, wherein the clip and the contact part are formed from a single cut and folded metal sheet.

14. An electronic circuit, comprising:
   a contact as claimed in claim 1;
   an insulating support; and
   an electrical track extending over the insulating support, the insulating support and the electrical track being pierced by a perforation, the contact surface being connected by material fusion to the electrical track, and the clip extending through the perforation.

15. The electrical contact as claimed in claim 1, wherein the contact part comprises at least one tongue, wherein the tongue includes at least part of an edge that forms said contact surface and is intended to bear on said surface of the support.

* * * * *